(12) United States Patent
Hori

(10) Patent No.: US 6,775,040 B2
(45) Date of Patent: Aug. 10, 2004

(54) SCANNING SYNC-SIGNAL DETECTING CIRCUIT FOR LASER SCANNER

(75) Inventor: Nobuyuki Hori, Saitama (JP)

(73) Assignee: PENTAX Corporation, Tokyo (JP)

( * ) Notice: Subject to any disclaimer, the term of this patent is extended or adjusted under 35 U.S.C. 154(b) by 0 days.

(21) Appl. No.: 09/906,139

(22) Filed: Jul. 17, 2001

(65) Prior Publication Data

US 2002/0012040 A1 Jan. 31, 2002

(30) Foreign Application Priority Data

Jul. 19, 2000 (JP) ........................................ P2000-218396

(51) Int. Cl.$^7$ ............................................. G02B 26/08
(52) U.S. Cl. ........................ 359/202; 250/234; 359/216
(58) Field of Search ................................. 359/196–226; 347/235, 248–250; 250/234–236

(56) References Cited

U.S. PATENT DOCUMENTS

| 5,001,341 A | 3/1991 | Negishi |
| 5,305,337 A | 4/1994 | Araki et al. |
| 5,461,414 A | 10/1995 | Honda et al. |
| 5,933,266 A | * 8/1999 | Minakuchi ................ 359/196 |

FOREIGN PATENT DOCUMENTS

| JP | 1-259316 | 10/1989 |
| JP | 5-50648 | 3/1993 |
| JP | 8-114760 | 5/1996 |
| JP | 10307267 | 11/1998 |

* cited by examiner

Primary Examiner—James Phan
(74) Attorney, Agent, or Firm—Greenblum & Bernstein, P.L.C.

(57) ABSTRACT

A scanning sync-signal detecting circuit for a laser scanner is provided. The circuit prevents misdetections of a horizontal sync signal caused by stray beams and enables a precise detection of the sync signal, independent of the beam power. The scanner comprises a laser detector and a sync-detecting circuit. The sync-detecting circuit detects a proper beam for generating the sync signal in accordance with the duration of the signal from the detector for which the signal level is higher than a predetermined level. The sync-detecting circuit comprises a ramp generator, a comparator, and a sync signal generator. The level of the ramp signal corresponds to the signal duration from the detector. The signal level is compared with a predetermined boundary level, so that the output signal due to the proper beam is detected.

18 Claims, 11 Drawing Sheets

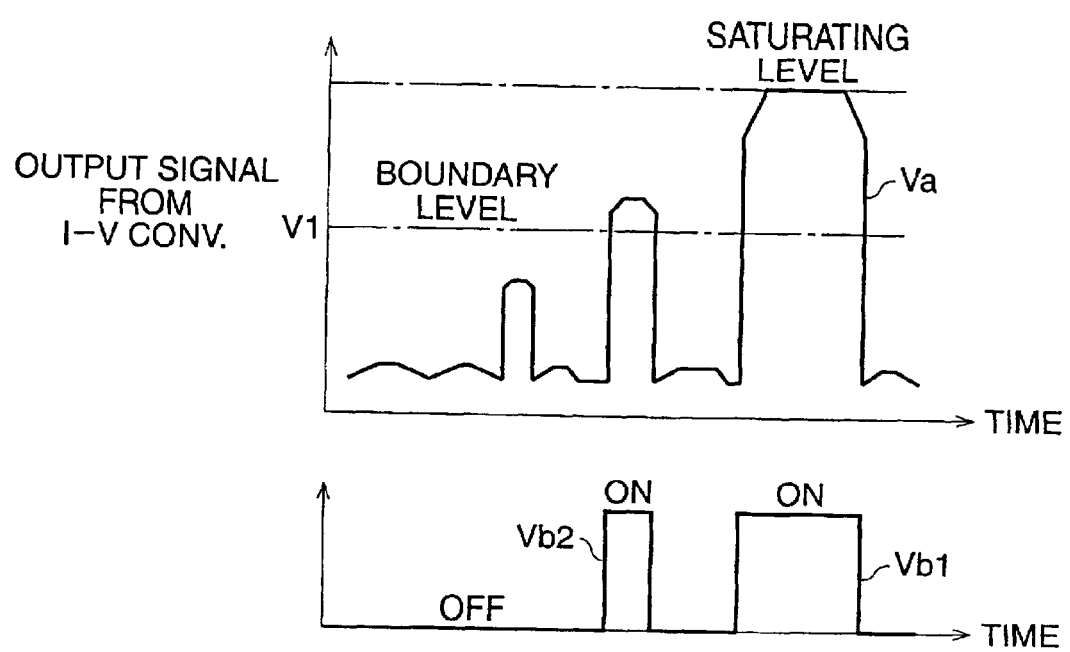

SCANNING SYNC-SIGNAL DETECTING CIRCUIT FOR LASER SCANNER

BACKGROUND OF THE INVENTION

1. Field of the Invention

The present invention relates to a laser scanner for which the light source is comprised of a semiconductor laser. In particular, it relates to a circuit for detecting a scanning sync signal that is used for controlling the timing of a laser beam scanning.

2. Description of the Related Art

In a laser scanner which utilizes a semiconductor laser and so forth for a light source, a required graphic pattern is transferred to a photosensitive member by driving the photosensitive member in a sub scanning (vertical scanning) direction while a main scanning (horizontal scanning) is carried out for the photosensitive member by the laser beam. In this type of the laser scanner, the horizontal scanning of the laser beam should be synchronized with the vertical scanning motion of the photosensitive member. Therefore, a detection of a horizontal sync signal is required.

For example, FIG. 7 illustrates a general construction of a laser scanner 1. A laser beam LB, emitted from a semiconductor laser 11, is collimated by a collimator lens 13 and shaped through a cylindrical lens 14, then projected to a polygon mirror 15 which is rotating at high speed. The laser beam LB is then reflected toward a direction of the main scanning by a reflecting mirror of the polygon mirror 15, and the main scanning at a photosensitive surface of a photosensitive drum is carried out via an fθ lens 16. The photosensitive drum 17 has the rotating axis 17a which is parallel with the main scanning direction. The drum is rotated around the rotating axis 17a, so that the photosensitive drum is sub scanned by the laser beam LB and a required pattern is formed on the drum surface.

Further, a laser detector 12, comprised of a photodiode, is disposed at a side of the photosensitive drum 17. The detector 12 receives the laser beam LB just before the beginning of each main scanning and sends detecting signals to a sync-detecting circuit 2. From the detecting signals, the sync-detecting circuit 2 generates a horizontal synchronizing signal HSYNC which standardizes the timing of the main scanning. Proper horizontal scanning with the laser beam LB is achieved by controlling the speed and timing of the polygon mirror's 15 rotation, so that the horizontal synchronizing signals are generated in a predetermined timing.

In general, as for the above-mentioned laser detector 12, a package-made detector is used. As shown in FIG. 8, a photodetector 32 is provided in the package. The photodetector 32 is disposed on a photodetector circuit board 31 and is electrically connected to the circuit patterns 34 of the circuit board 31 with bonding wires (jumper wires) 33, and entirely enclosed with a transparent resin 35.

Laser beam scans over the laser detector 12 are in the order A, B, C, and D shown in the figure. However, in the case of the type of laser detector 12, laser beams, such as B, C, or D, which penetrate the transparent resin 35 before and after the proper beam to be detected for generating the horizontal synchronizing signal, which incidents straight on the photodetector 32, are reflected by the circuit patterns 34 of the photodetector circuit board 31 and bonding wires 33 and the like, or by the inner surface of the transparent resin 35. The reflected laser beams are then made incident to the photodetector 32 as stray light. Therefore, in some cases, the laser detector 12 misidentifies these stray lights as a horizontal synchronizing signal. As a result, when the misdetection of a horizontal synchronizing signal occurs, the laser scanner 1 fails in transferring a proper image.

In the case of the laser detector shown in FIG. 8, in order to avoid the above misdetection of the horizontal synchronizing signals, a stray-beam-preventing slit board 37 may be provided to reduce the stray beams made incident on the photodetector 32 by allowing only the proper beam to penetrate the slit. However, it is difficult to prevent the generation of the stray beams originating from the proper beam, the beams which penetrate the slit board 37, and light reflected inside the laser detector as described above.

Further, although the antireflection coating (not shown) for preventing the reflection inside laser detector may be applied for structural improvement, it is still difficult to completely prevent the reflection.

Furthermore, from the aspect of an electrical circuit, a sync-detecting circuit can be designed to reject a detecting signal arising during a period when no synchronizing signal should possibly be detected. However, it is hard to distinguish and reject a detecting signal generated by the stray beams from the proper signal when the detecting signal arises at a time close to the time of the proper beam to be detected. As a result, the misdetection of the synchronizing signal induced by the stray beams remains.

Since the stray beams are reflected several times before they reach the photodetector, the power of each stray beam is attenuated and is lower than that of the proper beam. Thus the stray beams may be distinguished and rejected by setting a slice or boundary level of the slice circuit for output of the laser detector.

FIG. 9 illustrates an example of the slice circuit of the sync-detecting circuit to which the boundary level is applied. Waveforms illustrated in FIG. 10A represent normal behavior of the sync-detecting circuit. A photocurrent produced in the laser detector 12 by the effect of incident laser beam LB is transferred to a voltage output Va at an I-V converter 301, and then applied to the noninverting input terminal of a comparator 302. A standard voltage V1 that is higher than the voltage normally produced by the stray beams is applied to the inverting input terminal of the comparator 302 from a criterion power source 303. The output voltage Va and the standard voltage V1 are compared at the comparator 302. When the output Va is higher than the standard voltage V1, a high level output Vb is output from the comparator 302 and the horizontal synchronizing signal HSYNC is output from a driver 304 in accordance with the output Vb. Namely, outputs of the horizontal synchronizing signals can be synchronized with the laser beam LB reception at the laser detector 12 by classifying the output signal Va as to the boundary level which is set to the standard voltage V1.

However, in the case of a laser scanner for which the power of the proper beams are varyingly controlled, such as a laser scanner that controls the power of the laser in accordance with the sensitivity of the photosensitive member or the depth of the image to be formed, a stray beam may be detected as the synchronizing signal.

For example, as shown in FIG. 10A, when the powers of the stray beams are sufficiently small compared to the power of the proper beam, the proper beam can be discriminated from the stray beams by setting the boundary level or the standard voltage appropriately, so that the synchronizing signals are detected properly, as described above. However, as shown in FIG. 10B, when the power of the laser beam is increased and the output Va of the proper beam exceeds a saturating level of the photodetector, the power of the stray beam is increased as well. So that, in this case, the output Va of the stray beam may exceed the boundary level V1. As a result, the comparator 302 may output Vb2 by the stray beam as well as output Vb1 by the proper beam. Thus, the driver 304 may output the synchronizing signal HSYNC in error, in accordance with the output Vb2 by the stray beam.

Further, the power level of the stray laser beam, in the high-power mode, may become higher than the level of the proper laser beam in the low power mode depending on the setting of the laser power controls. In this case, if the standard voltage of the boundary level is set at a certain constant voltage, the stray beam may be detected as the synchronizing signal.

SUMMARY OF THE INVENTION

Therefore, an object of the present invention is to provide a synchronizing signal detecting circuit for a laser scanner that prevents misdetections of a synchronizing signal by a stray beam and enables a precise detection of the synchronizing signal, independent of the laser beam power.

According to the present invention, a scanning sync-signal detecting circuit is provided that is utilized in a laser scanner that comprises a laser detector for detecting a laser beam to be scanned and a sync-detecting circuit that processes an output signal from the laser detector so as to output a scanning sync signal.

The sync-detecting circuit detects a proper beam for generating the scanning sync signal in accordance with the duration of the output signal of which the level is higher than a predetermined level. The sync-detecting circuit then generates the scanning sync signal in accordance with the proper beam.

From another aspect of the present invention, a laser scanner is provided that utilizes the above sync-detecting circuit.

For example, the sync-detecting circuit comprises a ramp generator, a comparator, and a sync signal generating processor. The ramp generator generates a ramp signal of which the level corresponds to the duration of the output signal from the laser detector. The comparator compares the level of the ramp signal with a predetermined boundary level, so that the output signal due to the proper beam is detected. The sync signal generating processor generates the scanning sync signal depending on the output of the comparator.

In the above example, the sync-detecting circuit is preferable to comprise a pre-comparator that compares the output signal from the laser detector with a predetermined pre-boundary level. The pre-comparator feeds the output signal to the ramp generator while said output signal from the laser detector is above or equal to the pre-boundary level, so that the ramp signal is generated.

Further it is also preferable that the ramp generator integrates signals at a predetermined level while the output signal from the pre-comparator is input to the ramp generator, so that the ramp signal is generated.

In another example, the sync-detecting circuit comprises a clock, a counter, a count-number comparator, and a sync signal generating processor. The clock generates regular clock pulses and the counter counts the clock pulses while the output signal from the laser detector is input to the counter. The count-number comparator compares a count number counted at the counter with a predetermined criterion number, so that an output signal from the laser detector, which corresponds to the count number above or equal to the criterion number, is detected as a signal due to the proper beam. The sync signal generating processor generates the scanning sync signal in accordance with an output signal from the count-number comparator.

In the above example, the sync-detecting circuit is preferable to comprise a pre-comparator that compares the output signal from the laser detector with a predetermined pre-boundary level. The pre-comparator feeds the output signal to the counter, while the output signal from the laser detector is above or equal to the pre-boundary level, so that the count number is obtained.

Further preferably, the counter counts the clock pulses while the output signal from the pre-comparator is input to the counter. The count number of the continuous clock pulses is only output from the pre-comparator.

Furthermore, the laser scanner preferably comprises a horizontal scanning processor and a vertical scanning processor. The horizontal scanning processor scans the laser beam in a horizontal direction and the vertical scanning processor scans the horizontal laser beam in a direction vertical to the horizontal direction. Moreover, the laser detector detects the laser beam being horizontally scanned and the sync-detecting circuit detects a horizontal synchronizing signal.

An example of the laser detector is a package-made detector. The detector comprises a photodetector and outputs a detecting signal when the photodetector receives the laser beam on a receiving surface.

BRIEF DESCRIPTION OF THE DRAWINGS

The objects and advantages of the present invention will be better understood from the following description, with reference to the accompanying drawings in which:

FIGS. 10A and 10B show waveform diagrams to illustrate a signal processing in the prior art.

DESCRIPTION OF THE PREFERRED EMBODIMENTS

Figure 1:
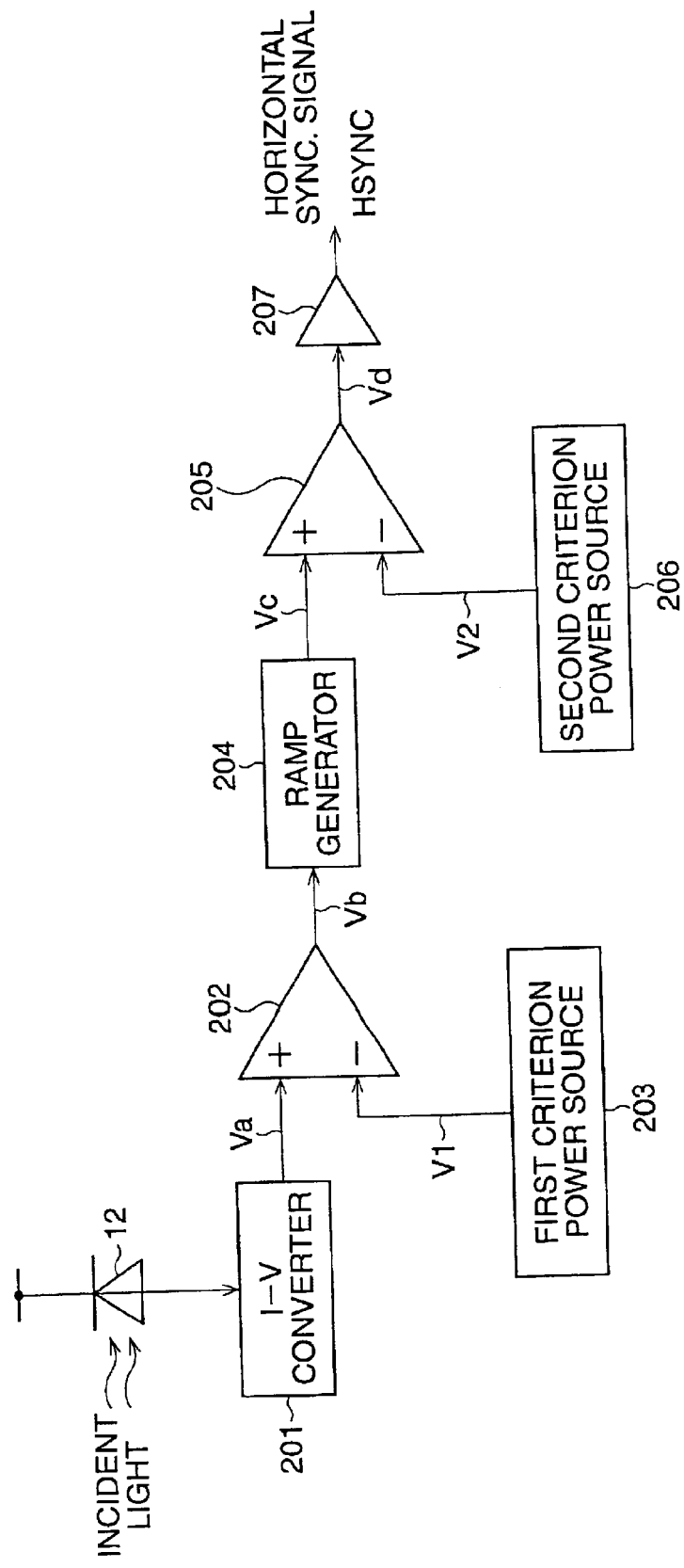
FIG. 1 is an electric schematic of a sync-detecting circuit of a first embodiment to which the present invention is applied.

The present invention is described below with reference to embodiments shown in the drawings.

Figure 7:
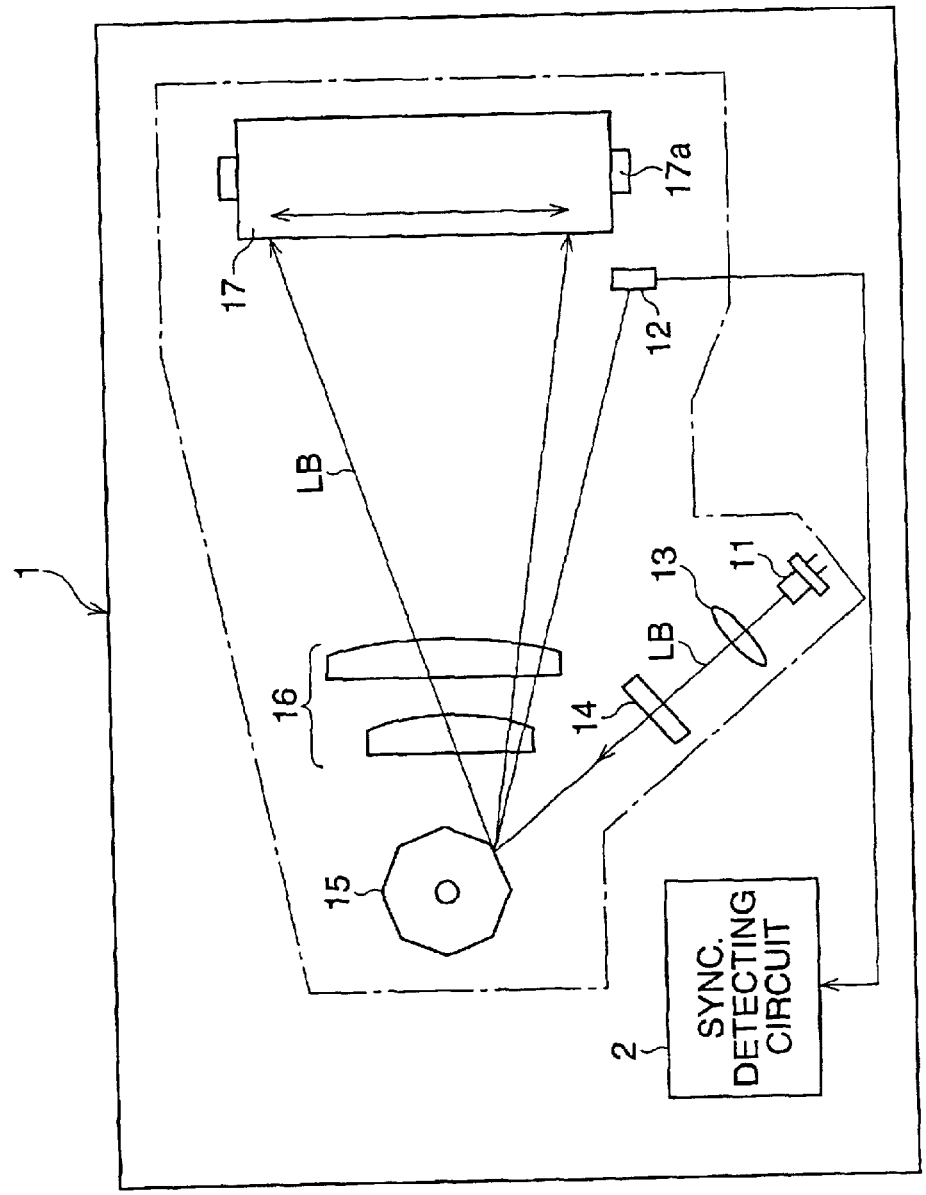
FIG. 7 schematically illustrates the structure of the laser scanner to which the embodiments of the present invention are applied.
Figure 8:
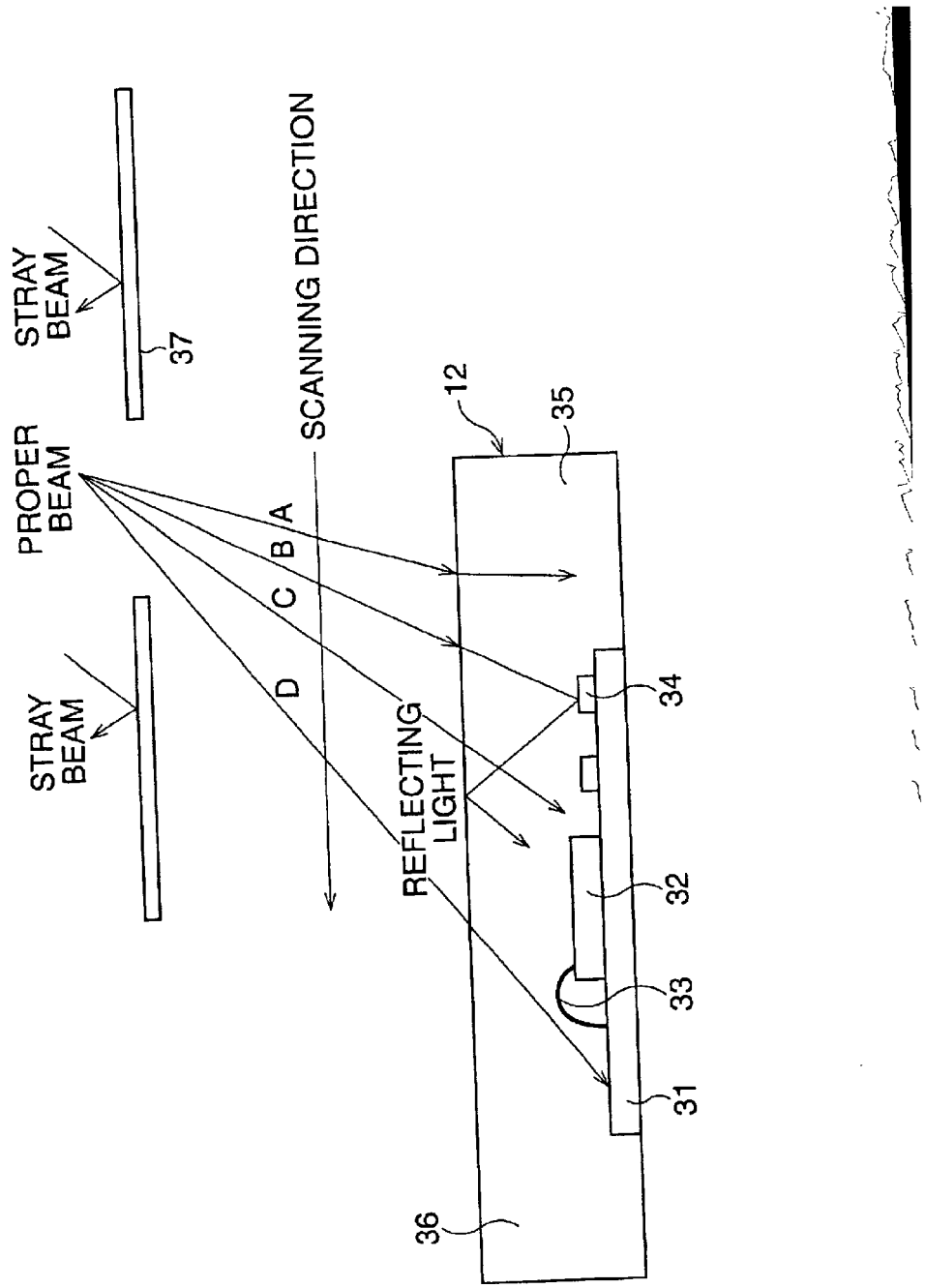
FIG. 8 schematically shows a sectional view of a laser detector to illustrate the principle of stray beams generated in the, laser detector applied in the laser scanner.
Figure 9:
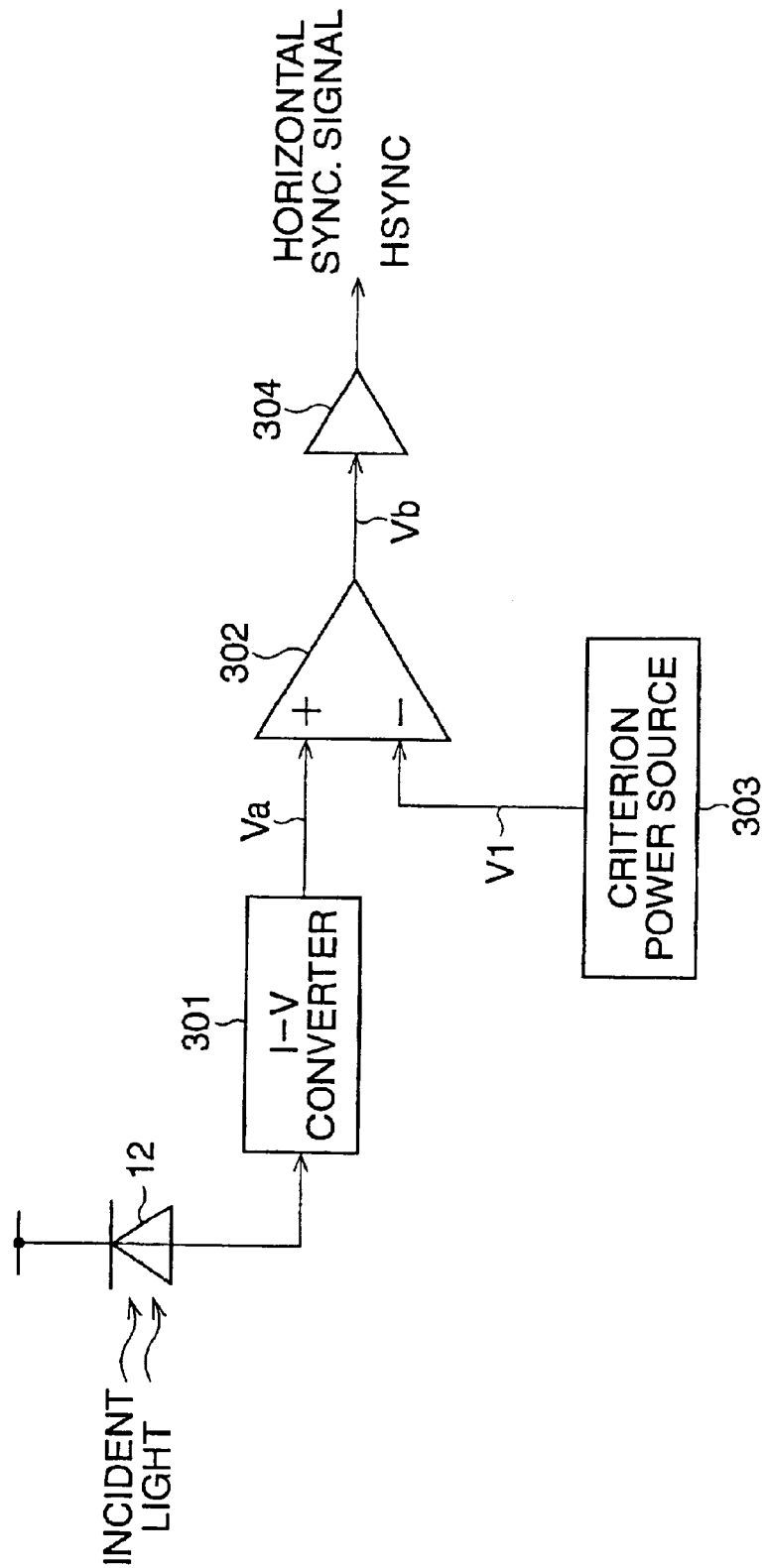
FIG. 9 illustrates an electric schematic of a sync-detecting circuit of the prior art.
Figure 10A:
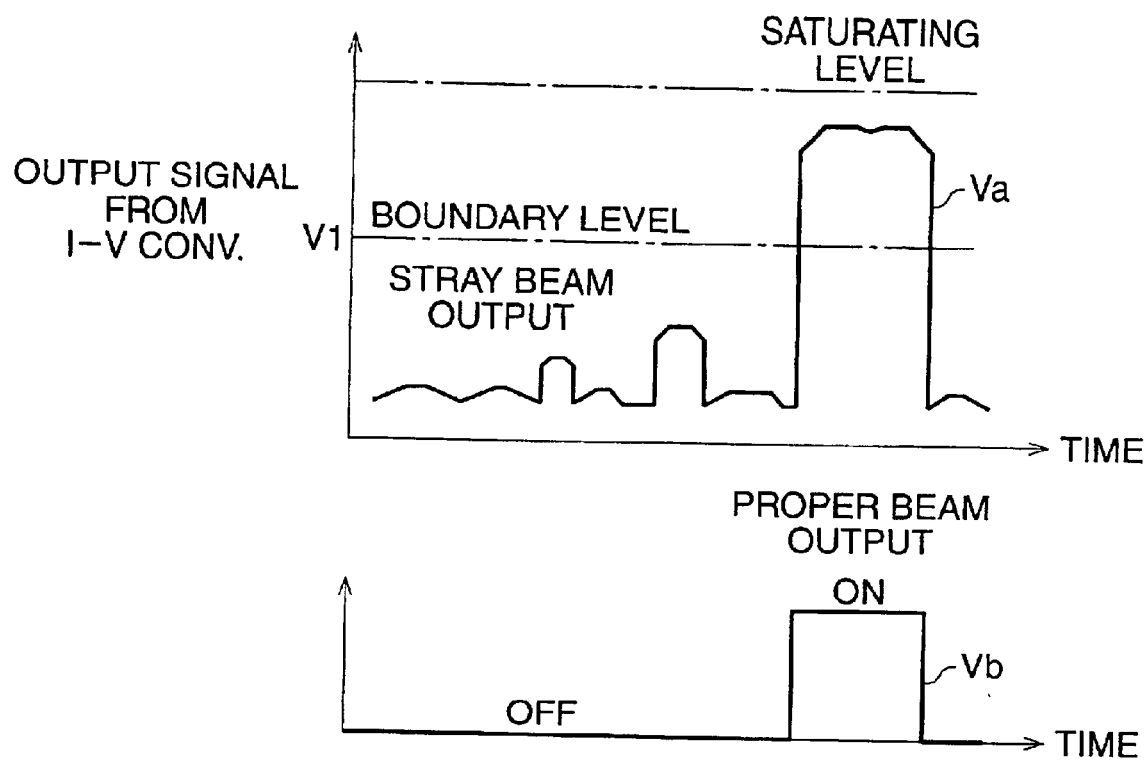

FIG. 1 is a circuit diagram of a sync-signal detecting circuit 2 of a first embodiment, which is applied to a laser scanner of the present invention. The sync-signal detecting circuit 2 is connected to the laser detector 12 of the laser scanner 1, which is shown in FIG. 7. The structure described with reference to FIG. 8 is applied to the laser detector 12, so that I-V converter 201, which converts photocurrent signals to voltage signals, is connected to the photodetector, and the output Va from the I-V converter 201 is fed to a noninverting input terminal of a first comparator 202 or pre-comparator. Further, a pre-standard voltage or first standard voltage of a pre-criterion power source or first criterion power source 203 is applied to the inverting input terminal of the first comparator 202. The first comparator 202 compares a potential level of an output Va from the I-V converter 201, and the level of the first standard voltage V1. When the output Va is higher than the first standard voltage V1, a first output signal Vb is then output from the first comparator 202.

Further, a ramp generator 204 that generates a ramp signal, which increases linearly in value then returns to zero suddenly to start the next ramp, is connected to the output terminal of the first comparator 202. For example, the ramp generator 204 is comprised of an integrator that integrates input signals at a predetermined level with respect to time while the first output signal Vb is output. So that an output signal, or a ramp signal output Vc, from the ramp generator 204 is formed in a right triangular sawtooth waveform, in which the base side along the time axis is nearly identical to the output period of the first output signal Vb.

The output terminal of the ramp generator 204 is connected to the noninverting input terminal of the second comparator 205 which functions as a main comparator, thus the ramp signal output Vc from the ramp generator 204 is input to the terminal. A second standard voltage V2, which is supplied from a second criterion power source 206 that is maintained at a predetermined potential, is applied to the inverting input terminal of the second comparator 205. The second comparator 205 compares the output signal Vc from the ramp generator 204 and the second standard voltage V2. When the output signal Vc from the ramp generator 204 is higher than the second standard voltage V2, a second output signal Vd is output from the output terminal of the second comparator 205. Further, a driver 207 is connected to the output terminal of the second comparator 205, and the driver 207 outputs the horizontal synchronizing signal SYNC in accordance with the second output signal Vd.

The functions of the sync-signal detecting circuit having the above structure are explained with reference to the waveform diagrams shown in FIG. 2.

As illustrated in FIG. 8, at the laser detector 12, laser beams which are not directly incident on the photodetector are reflected, generally diffused reflection, inside the laser detector and generate stray beams that incident on the photodetector. Therefore, the level of detecting signals generated by the stray beams is considerably lower than the signal level generated by the proper beam. At the same time, since the detecting signals of the photodetector generated by the incident stray beams on the photodetector are caused by the diffused reflection, a receiving time of the stray beam at the light-receiving surface of the photodetector is short. Consequently, output duration of the detecting signal from the photodetector caused by the stray beam is also short. The diagram of the output signals from the I-V converter or the photodetector in FIG. 2 illustrates the above conditions. Namely, the level and duration of the output signal Va from the I-V converter 201, which arise from the laser detector 12 due to a stray beam, are lower and shorter compared to the level and duration of the signal Va due to the proper beam.

Figure 2:
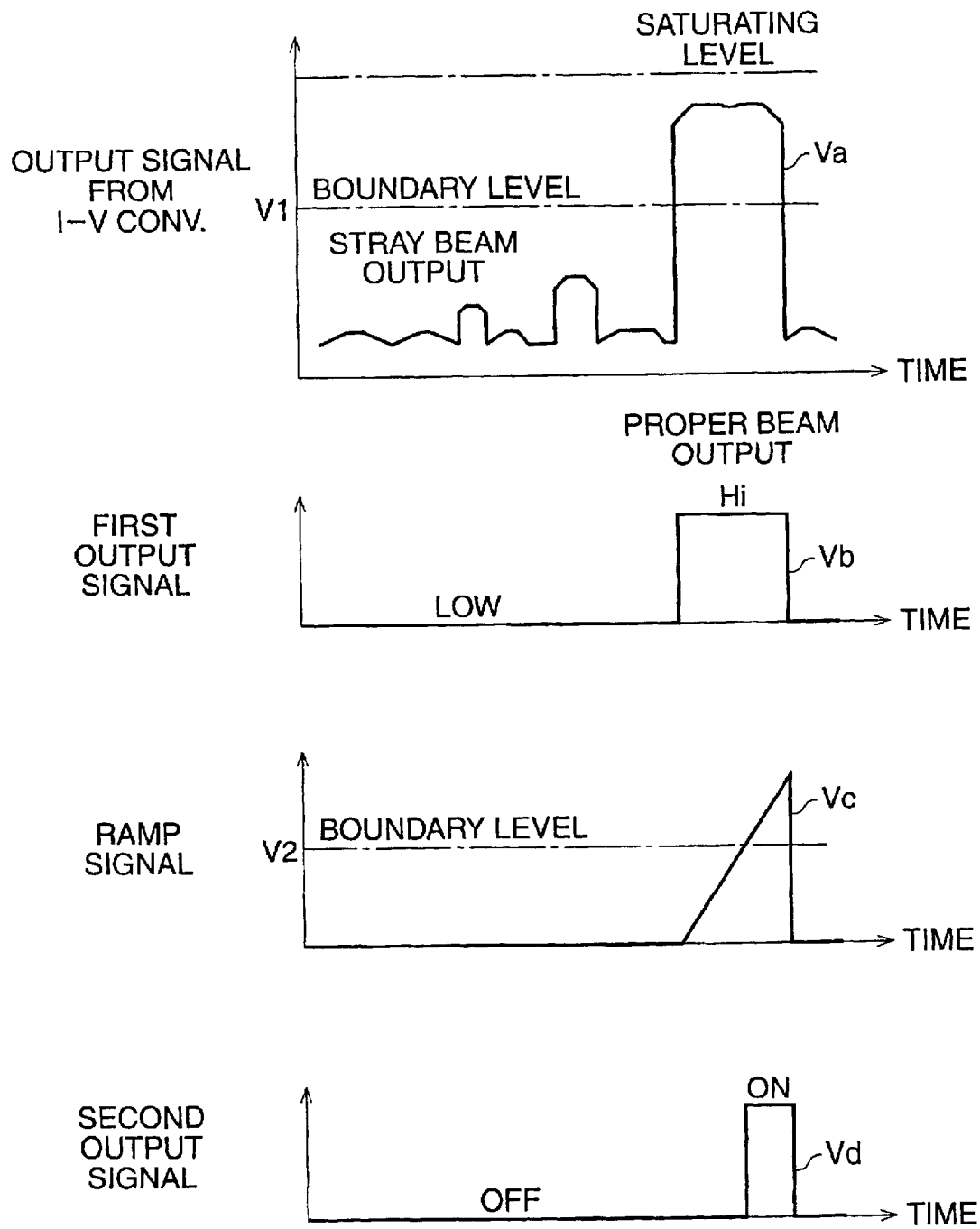
FIG. 2 shows waveform diagrams to illustrate a first type signal processing in the first embodiment.

Therefore, as illustrated in FIG. 2, the first output signal Vb due to the proper beam can be selectively output by setting the boundary level (pre-boundary level) to the first standard voltage V1 that can distinguish the detecting signals of the proper beams from the signals of the stray beams. The level of the first standard voltage V1 is determined from statistics of measurement that preliminarily carried out for the detecting signals due to the proper beam and stray beam. The ramp generator 204 then outputs saw tooth formed ramp signals Vc, as shown in FIG. 2, by integrating the predetermined level input during the first output signal Vb is input. Further, at the second comparator 205, the ramp signal Vc is compared with the second standard voltage V2 to which the boundary level is set, and the second comparator 205 outputs the second output signal Vd as illustrated in FIG. 2. The level of the second standard voltage V2 is also determined from the statistics of the measurement described above. The driver 207 may comprise a one-shot multivibrator, not shown, that is triggered at the rise of the second output signal Vd and generates a pulse signal with a predetermined duration, as the horizontal synchronizing signal SYNC. Therefore, in this case, the detecting signals due to the stray beams are rejected by the first comparator 202 and the misdetections of the horizontal synchronizing signal, which are caused by the stray beams, are prevented.

Figure 3:
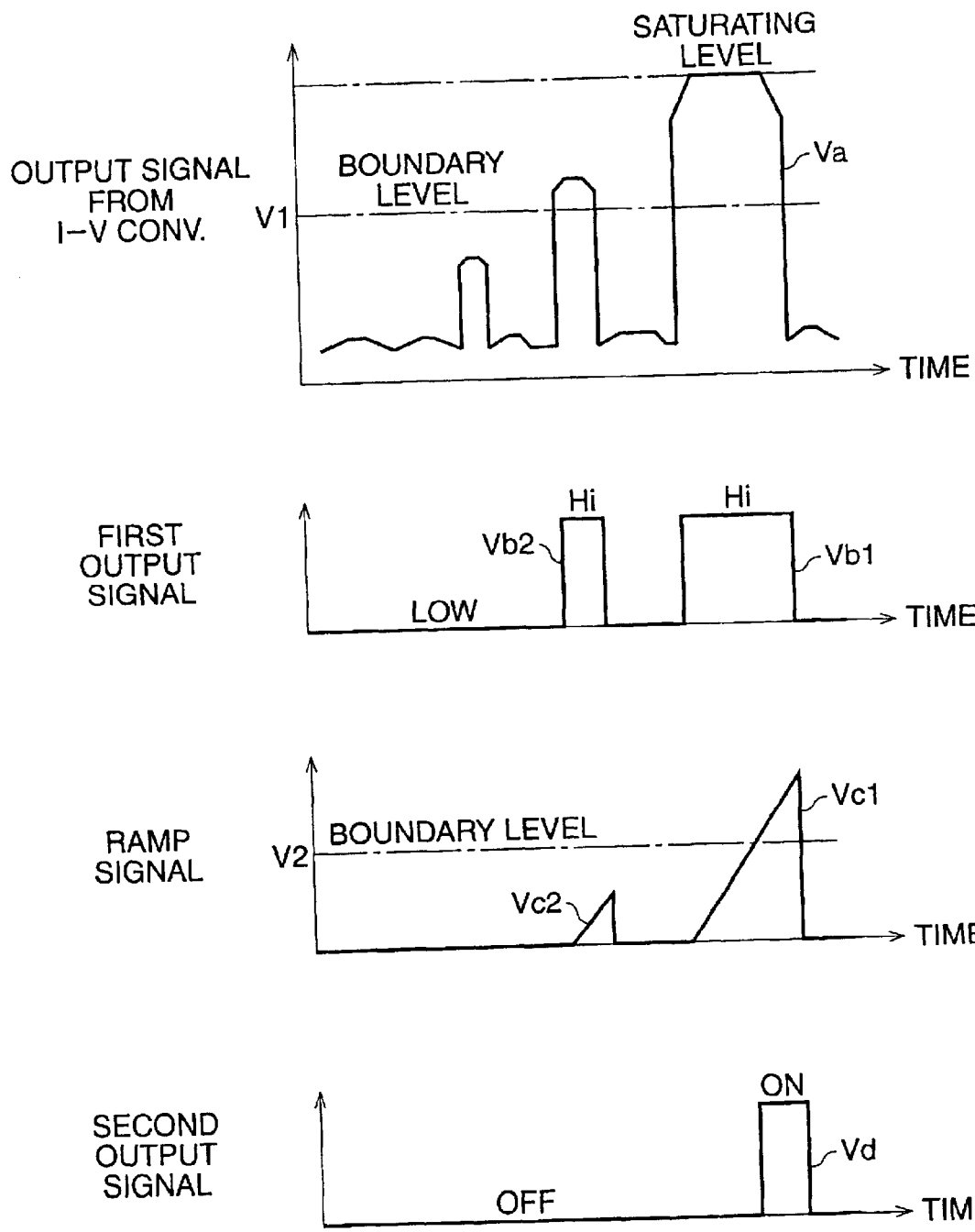
FIG. 3 shows waveform diagrams to illustrate a second type signal processing in the first embodiment.

With reference to FIG. 3, the case when the power of the laser beams is increased is explained. Note that, each of the diagrams in FIG. 3 corresponds to the respective diagrams of FIG. 2.

In this case, the level of the signals Va from the laser detector 12, which are due to the proper beams, reach a level that might exceed the saturating level, as illustrated in the diagram of the output signals from the I-V converter, which is shown in FIG. 3. Accordingly, the level of the detecting signal due to the stray beams may become higher than the first standard voltage V1. Therefore, although the first standard voltage V1 is set as the boundary level of the first comparator 202, signals due to the stray beam which have a level higher than the first standard voltage V1 may exist, so that not only the signal V1 due to the proper beam but also the signal Vb2 due to the stray beam may be output from the first comparator 202 as the first output signal Vb, as illustrated in FIG. 3.

However, since the ramp signal Vc generated from the first output signal Vb at the ramp generator 204 is an integral of the predetermined level of the signal with respect to time, the level of the ramp signals Vc1 due to the proper beam and Vc2 to the stray beam are proportional to the light-receiving time of each proper and stray beam. Namely, both the ramp signal Vc1 due to the proper beam and the ramp signal Vc2 due to the stray beam are independent of the signal level output from the laser detector 12, but depend on the time each beam is received at the photodetector. Consequently, as shown in FIG. 3, since the time for the stray beam to be received at the photodetector is shorter than that of the proper beam received in the scanning operation, the level of the ramp signal Vc2 is lower than that of the ramp signal Vc1.

The level of the ramp signals Vc1 and Vc2 are then compared with the second standard voltage V2 at the second comparator 205. From the difference between the light-receiving time of the proper beam and stray beam, the level of the ramp signal Vc2, due to the stray beam, never reaches the second standard voltage V2, so that only ramp signal Vc1, due to the proper beam, is output to the driver 207 as the second output signal Vd. The driver 207 then generates and outputs a signal with the predetermined duration as the horizontal synchronizing signal SYNC, in the same way mentioned above. Consequently, in the case of FIG. 3, although the first comparator 202 fails to reject the effect of the stray beam, it is rejected by the second comparator 205, so that the misdetection of the horizontal synchronizing signal due to the stray beam is prevented.

Figure 4:
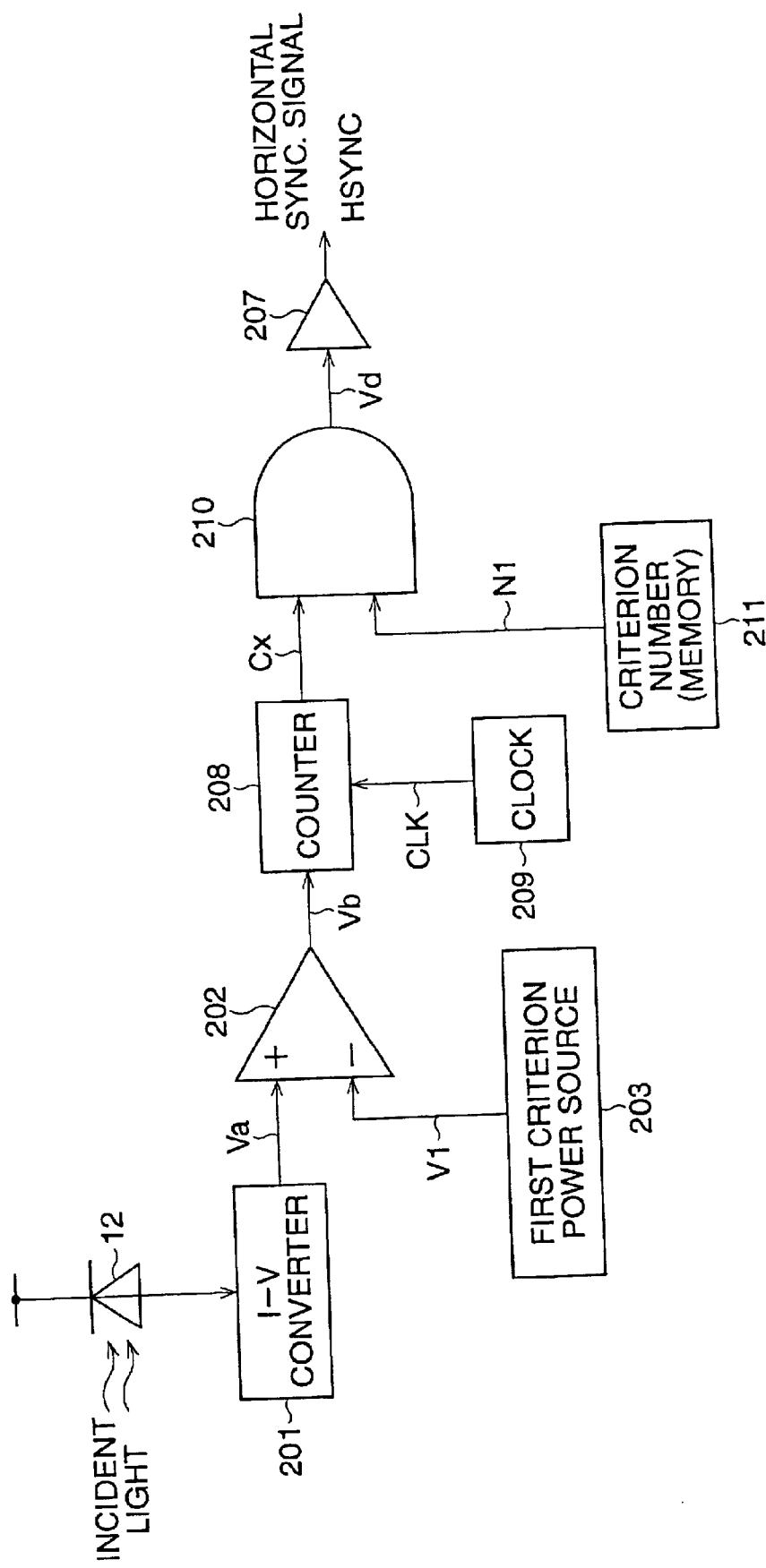
FIG. 4 is an electric schematic of a sync-detecting circuit of a second embodiment to which the present invention is applied.

FIG. 4 is a circuit diagram of the sync-signal detecting circuit of a second embodiment to which the present invention is applied. Note that, elements equivalent to those of the first embodiment are referred by the same reference numbers.

In the second embodiment, in place of the ramp generator 204 of the first embodiment, a circuit comprising a counter 208 and a count-number comparator 210 is applied. The counter 208 counts the number of clock pulses CLK which are fed from a clock (generator) 209. The count-number comparator 210 compares the number of clock pulses and a criterion number N1 set in memory 211. The clock pulses CLK are input to the counter 208 and the number of the clock pulses CLK is counted while the first output signal Vb is output from the first comparator 202. The count number Cx of the clock pulses CLK is then output from the counter 208. In this example, the counter 208 is comprised of a gate member and a counter member. The gate member controls an input of the clock pulses CLK in accordance with the first output signal Vb, and the counter member counts the number of the clock pulses which are sequentially input. Further, the criterion number N1 is set for '3' in this example, and the count-number comparator 210 compares the count number Cx from the counter 208 with the criterion number '3'. The count-number comparator 210 outputs a count signal Vd when the count number Cx is above or equal to '3'.

Figure 5:
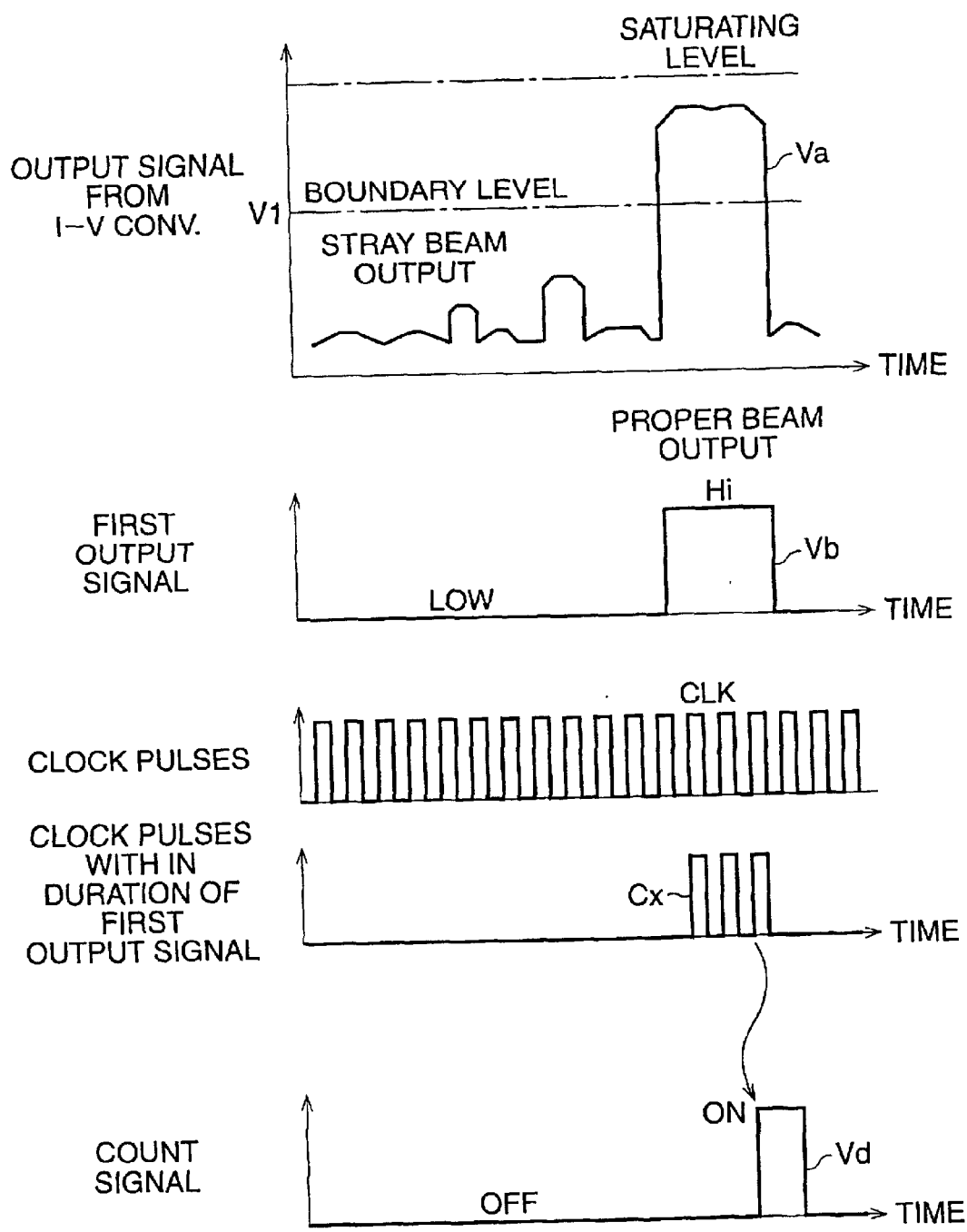
FIG. 5 shows waveform diagrams to illustrate a first type signal processing in the second embodiment.

With reference to the waveform diagrams shown in FIG. 5, the functions of the second embodiment are explained.

In FIG. 5, among the output signals Va from the I-V converter 201, the level and the duration of the signal due to the stray beam are lower and shorter than those of the signal due to the proper beam, as discussed in the first embodiment. The output signal Va and the first standard voltage V1, which is set for the boundary level, are compared, so that the signals due to the proper beams are selectively output as the first output signal Vb from the first comparator 202, as illustrated in FIG. 5. At the counter 208, the clock pulses CLK are counted while the first output signal Vb is output from the first comparator 202, and the count number Cx is output. In this example, as illustrated in FIG. 5, three clock pulses CLK are continuously counted within the duration of the first output signal Vb, so that '3' is output for the count number Cx. At the count-number comparator 210, the criterion number N1 for which '3' is set, and the count number Cx, i.e. '3', from the counter 208 are compared. Since the count number Cx satisfies the condition of which the number is above or equal to '3', the count signal Vd from the count-number comparator 210 is output to the driver 207, as shown in FIG. 5. At the driver 207, as in the first embodiment, a pulse signal with a predetermined duration is generated in accordance with the count signal Vd, and the generated pulse signal is output as the horizontal synchronizing signal HSYNC. Therefore, in this case, as described in FIG. 2 of the first embodiment, the detecting signals due to the stray beams are rejected by the first comparator 202 and the misdetections of the horizontal synchronizing signal, which are caused by the stray beams, are prevented.

Figure 6:
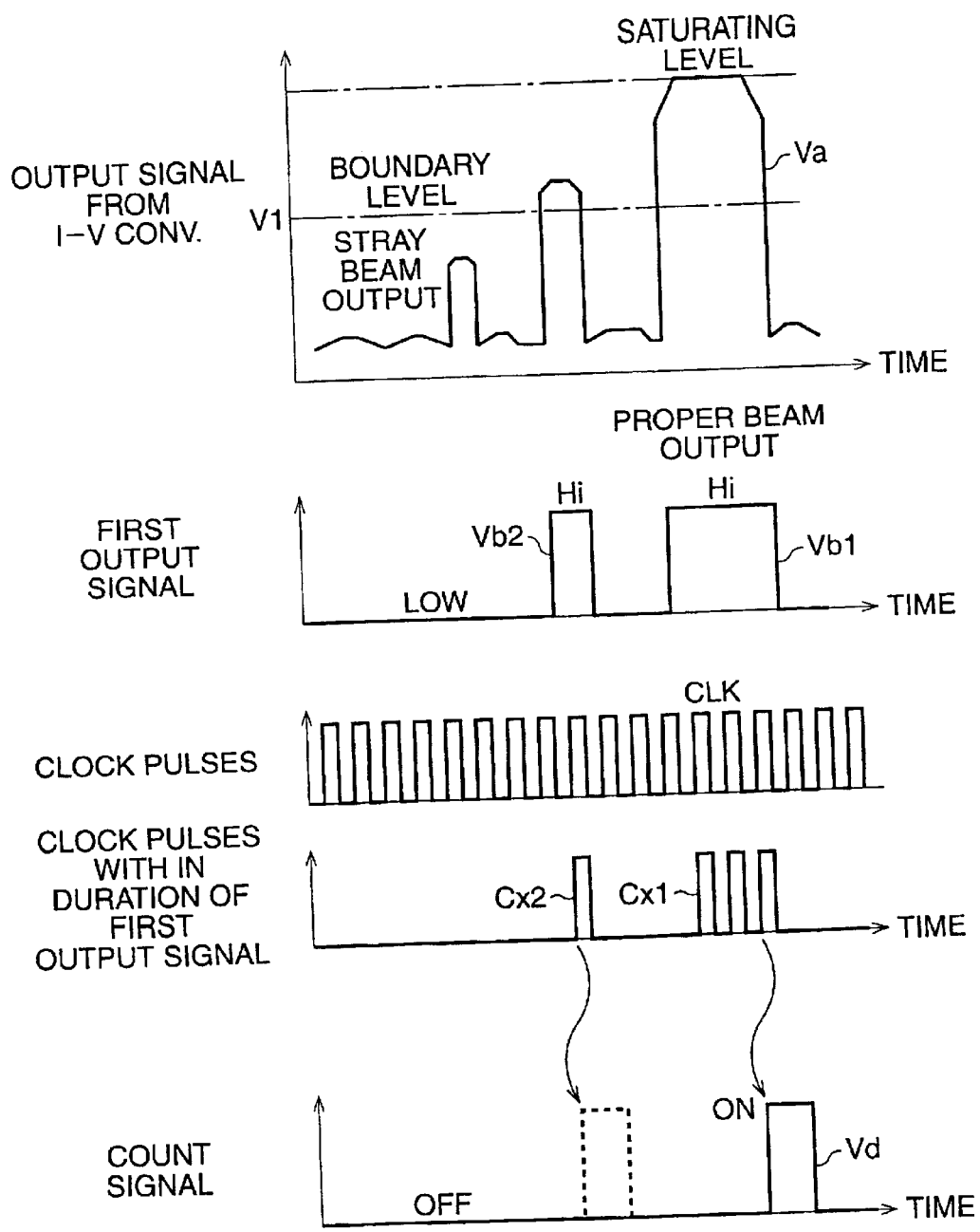
FIG. 6 shows waveform diagrams to illustrate a second type signal processing in the second embodiment.

With reference to FIG. 6, the case when the power of the laser beams is increased in the second embodiment is explained. Note that, the diagrams in FIG. 6 respectively correspond to the diagrams of FIG. 5.

In this case, the level of the signals Va from the I-V converter or the laser detector 12, which are due to the proper beams, reaches a level that might exceed the saturating level, as illustrated in FIG. 6. Accordingly, the level of the detecting signal due to the stray beams may become higher than the first standard voltage V1. Therefore, although the first standard voltage V1 is set as the boundary level of the first comparator 202, signals due to the stray beam and of which the level is higher than the first standard voltage V1 may exist, so that not only the signal V1 due to the proper beam but also the signal Vb2 due to the stray beam may be output for the first output signal Vb from the first comparator 202, as illustrated in FIG. 6. Therefore, the number of the clock pulses CLK is counted while the first output signal Vb1 or Vb2 is input to the counter 208. Consequently, the count number Cx of the clock pulses CLK which is counted within the duration of the first output signal Vb2 of the stray beam, is shorter than that counted within the duration of the first output signal Vb1 of the proper beam, since the time for the stray beam to be received at the photodetector is shorter than that of the proper beam received in the scanning operation, as described in the first embodiment. In this example, as illustrated in FIG. 6, the count number Cx2 of the clock pulse CLK, which is obtained by the output signal Vb2 of the stray beam, is '1', and the count number Cx1, which is obtained by the output signal Vb1 of the proper beam, is '3'. Note that, as mentioned above, the counter 208 counts only continuous or sequential clock pulses, so that the clock pulses CLK arise in the blank period, which exists between the output signal of the stray beam and the proper beam, are not counted. Therefore, the count numbers Cx2 and Cx1 of the sequential clock pulses within the duration of first output signals Vb2 and Vb1 are set as '1' and '3' with no confusion.

When the count number '1' is compared with the criterion number '3' at the count-number comparator 210, because the count number that corresponds to the stray beam is below the criterion number '3', no count signal is output from the counter-number comparator 210. The signal illustrated in FIG. 6 with the phantom line indicates a signal that corresponds to the ideal count signal due to the stray beam. On the other hand, the count number '3' is equal to the criterion number '3', thus the count signal Vd is output from the count-number comparator 210. This substantial count signal Vd is indicated with the solid line in FIG. 6. In the driver 207, the signal with the predetermined pulse width or duration is generated in accordance with the count signal Vd fed from the count-number comparator 210. The drive 207 then outputs the generated signal as the horizontal synchronizing signal HSYNC. Consequently, in the case of FIG. 6, although the first comparator 202 fails to reject the effect of the stray beam, it is rejected by the count-number comparator 210, so that the misdetection of the horizontal synchronizing signal due to the stray beam is prevented.

In place of the ramp generator 204 in the first embodiment of the present invention, any of the other circuit variations can also be applied, as long as a ramp signal of which the level correlates with or is proportional to the duration of the first output signal Vb from the first comparator 202 is obtainable. Further, the counter 208 in the second embodiment may be comprised of AND gates and so on, instead of the gate member and the count member as illustrated in the embodiment.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Application No. 2000-218396 (filed on Jul. 19, 2000) which is expressly incorporated herein, by reference, in its entirety.

What is claimed is:

1. A scanning sync-signal detecting circuit utilized in a laser scanner that comprises, a laser detector for detecting a laser beam to be scanned and a sync-detecting circuit that processes an output signal from said laser detector so as to output a scanning sync signal;

wherein said sync-detecting circuit detects a proper beam for generating said scanning sync signal in accordance with the duration of said output signal of which the level is higher than a predetermined level and generates said scanning sync signal.

2. A scanning sync-signal detecting circuit according to claim 1, wherein said sync-detecting circuit comprising:

a ramp generator that generates a ramp signal of which the level corresponds to said duration of said output signal from said laser detector;

a comparator that compares said level of said ramp signal with a predetermined boundary level, so that said output signal due to said proper beam is detected; and a sync signal generating processor that generates said scanning sync signal as to an output of said comparator.

3. A scanning sync-signal detecting circuit according to claim 2, wherein said sync-detecting circuit comprises a pre-comparator that compares said output signal from said laser detector with a predetermined pre-boundary level and feeds said output signal to said ramp generator, while said output signal from said laser detector is above or equal to said pre-boundary level, so that said ramp signal is generated.

4. A scanning sync-signal detecting circuit according to claim 3, wherein said ramp generator integrates signals at a predetermined level while said output signal from said pre-comparator is input to said ramp generator, so that said ramp signal is generated.

5. A scanning sync-signal detecting circuit according to claim 1, wherein said sync-detecting circuit comprising:

a clock that generates clock pulses;

a counter that counts said clock pulses while said output signal from said laser detector is input to said counter;

a count-number comparator that compares a count number counted at said counter with a predetermined criterion number, so that an output signal from said laser detector, which corresponds to said count number above or equal to said criterion number, is detected as a signal due to said proper beam; and a sync signal generating processor that generates said scanning sync signal in accordance with an output signal from said count-number comparator.

6. A scanning sync-signal detecting circuit according to claim 5, wherein said sync-detecting circuit comprises a pre-comparator that compares said output signal from said laser detector with a predetermined pre-boundary level and feeds said output signal to said counter, while said output signal from said laser detector is above or equal to said pre-boundary level, so that said count number is obtained.

7. A scanning sync-signal detecting circuit according to claim 6, wherein said counter counts said clock pulses while said output signal from said pre-comparator is input to said counter and said count number of said clock pulses of which the pulses are continuous is output.

8. A scanning sync-signal detecting circuit according to claim 1, wherein said laser scanner comprises:

a horizontal scanning processor that scans said laser beam in a horizontal direction; and a vertical scanning processor that scans the horizontal laser beam in a direction vertical to said horizontal direction;

wherein said laser detector detects said laser beam being horizontally scanned and said sync-detecting circuit detects a horizontal synchronizing signal.

9. A scanning sync-signal detecting circuit according to claim 1, wherein said laser detector is a package that comprises a photodetector, and outputs a detecting signal when said photodetector receives said laser beam on a receiving surface.

10. A laser scanner comprising:

a laser detector for detecting a laser beam to be scanned; and a sync-detecting circuit that processes an output signal from said laser detector so as to output a scanning sync signal;

wherein said sync-detecting circuit detects a proper beam for generating said scanning sync signal in accordance with the duration of said output signal of which the level higher than a predetermined level and generates said scanning sync signal.

11. A laser scanner according to claim 10, wherein said sync-detecting circuit comprising:

a ramp generator that generates a ramp signal of which the level corresponds to said duration of said output signal from said laser detector;

a comparator that compares said level of said ramp signal with a predetermined boundary level, so that said output signal due to said proper beam is detected; and a sync signal generating processor that generates said scanning sync signal depending on the output of said comparator.

12. A laser scanner according to claim 11, wherein said sync-detecting circuit comprises a pre-comparator that compares said output signal from said laser detector with a predetermined pre-boundary level and feeds said output signal to said ramp generator, while said output signal from said laser detector is above or equal to said pre-boundary level, so that said ramp signal is generated.

13. A laser scanner according to claim 12, wherein said ramp generator integrates signals at a predetermined level while said output signal from said pre-comparator is input to said ramp generator, so that said ramp signal is generated.

14. A laser scanner according to claim 10, wherein said sync-detecting circuit comprises:

a clock that generates clock pulses;

a counter that counts said clock pulses while said output signal from said laser detector is input to said counter;

a count-number comparator that compares a count number counted at said counter with a predetermined criterion number, so that an output signal from said laser detector, which corresponds to said count number above or equal to said criterion number, is detected as a signal due to said proper beam; and a sync signal generating processor that generates said scanning sync signal in accordance with an output signal from said count-number comparator.

15. A scanning sync-signal detecting circuit according to claim 14, wherein said sync-detecting circuit comprises a pre-comparator that compares said output signal from said laser detector with a predetermined pre-boundary level and feeds said output signal to said counter, while said output signal from said laser detector is above or equal to said pre-boundary level, so that said count number is obtained.

16. A laser scanner according to claim 15, wherein said counter counts said clock pulses while said output signal from said pre-comparator is input to said counter and said count number of said clock pulses of which the pulses are continuous is output.

17. A laser scanner according to claim 10, wherein said laser scanner comprises:

a horizontal scanning processor that scans said laser beam in a horizontal direction; and a vertical scanning processor that scans the horizontal laser beam scanning in a direction vertical to said horizontal direction;

wherein said laser detector detects said laser beam being horizontally scanned and said sync-detecting circuit detects a horizontal synchronizing signal.

18. A laser scanner according to claim 10, wherein said laser detector is a package that comprises a photodetector, and outputs a detecting signal when said photodetector receives said laser beam on a receiving surface.

* * * * *